US009923095B2

(12) United States Patent
Chien et al.

(10) Patent No.: US 9,923,095 B2
(45) Date of Patent: Mar. 20, 2018

(54) MANUFACTURING METHOD OF NON-PLANAR FET

(71) Applicant: UNITED MICROELECTRONICS CORP., Hsin-Chu (TW)

(72) Inventors: Chin-Cheng Chien, Tainan (TW); Chun-Yuan Wu, Yun-Lin County (TW); Chih-Chien Liu, Taipei (TW); Chin-Fu Lin, Tainan (TW); Chia-Lin Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/379,486

(22) Filed: Dec. 15, 2016

(65) Prior Publication Data

US 2017/0098710 A1    Apr. 6, 2017

Related U.S. Application Data

(62) Division of application No. 13/447,286, filed on Apr. 16, 2012, now Pat. No. 9,559,189.

(51) Int. Cl.
*H01L 29/165* (2006.01)
*H01L 29/66* (2006.01)
*H01L 29/78* (2006.01)
*H01L 29/06* (2006.01)
*H01L 29/08* (2006.01)

(52) U.S. Cl.
CPC ...... *H01L 29/7853* (2013.01); *H01L 29/0653* (2013.01); *H01L 29/0847* (2013.01); *H01L 29/66795* (2013.01)

(58) Field of Classification Search
CPC ............. H01L 29/165; H01L 29/66795; H01L 29/7853; H01L 29/0653; H01L 29/0847; H01L 29/205; H01L 29/7606
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |

(Continued)

FOREIGN PATENT DOCUMENTS

TW    I305053    1/2009

*Primary Examiner* — Mark Tornow
*Assistant Examiner* — Priya Rampersaud
(74) *Attorney, Agent, or Firm* — Winston Hsu

(57) ABSTRACT

The present invention provides a non-planar FET and a method of manufacturing the same. The non-planar FET includes a substrate, a fin structure, a gate and a gate dielectric layer. The fin structure is disposed on the substrate. The fin structure includes a first portion adjacent to the substrate wherein the first portion shrinks towards a side of the substrate. The gate is disposed on the fin structure. The gate dielectric layer is disposed between the fin structure and the gate. The present invention further provides a method of manufacturing the non-planar FET.

10 Claims, 8 Drawing Sheets

(56) References Cited

U.S. PATENT DOCUMENTS

| | | |
|---|---|---|
| 7,470,570 B2 | 12/2008 | Beintner |
| 7,531,437 B2 | 5/2009 | Brask |
| 7,569,857 B2 | 8/2009 | Simon |
| 7,781,771 B2 | 8/2010 | Lindert |
| 7,915,693 B2 | 3/2011 | Okano |
| 8,993,384 B2 | 3/2015 | Hung |
| 9,337,315 B2 | 5/2016 | Basker |
| 2004/0195624 A1 | 10/2004 | Liu |
| 2005/0051825 A1 | 3/2005 | Fujiwara |
| 2005/0156202 A1* | 7/2005 | Rhee ............... H01L 29/66795 257/213 |
| 2006/0086977 A1 | 4/2006 | Shah |
| 2006/0099830 A1 | 5/2006 | Walther |
| 2006/0286729 A1 | 12/2006 | Kavalieros |
| 2007/0108528 A1 | 5/2007 | Anderson |
| 2007/0145487 A1 | 6/2007 | Kavalieros |
| 2007/0158756 A1 | 7/2007 | Dreeskornfeld |
| 2007/0241399 A1 | 10/2007 | Irisawa |
| 2007/0257296 A1 | 11/2007 | Miyano |
| 2008/0157208 A1 | 7/2008 | Fischer |
| 2008/0237575 A1 | 10/2008 | Jin |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0052059 A1 | 3/2010 | Lee |
| 2010/0072553 A1 | 3/2010 | Xu |
| 2010/0144121 A1 | 6/2010 | Chang |
| 2010/0167506 A1 | 7/2010 | Lin |
| 2011/0278676 A1 | 11/2011 | Cheng |
| 2013/0249003 A1 | 9/2013 | Oh |
| 2013/0334606 A1 | 12/2013 | Shen |
| 2014/0151761 A1 | 6/2014 | Hsieh |
| 2014/0346617 A1 | 11/2014 | Kim |
| 2014/0377926 A1 | 12/2014 | Kim |
| 2015/0318169 A1 | 11/2015 | Qi |
| 2015/0340471 A1 | 11/2015 | Lim |

* cited by examiner

MANUFACTURING METHOD OF NON-PLANAR FET

CROSS REFERENCE TO RELATED APPLICATIONS

This application is a Divisional of application Ser. No. 13/447,286 filed Apr. 16, 2012, and included herein by reference.

BACKGROUND OF THE INVENTION

1. Field of the Invention

The present invention relates to a non-planar FET and a manufacturing method thereof, and more particularly to a non-planar FET which includes an octagonal fin structure and a manufacturing method thereof.

2. Description of the Prior Art

In recent years, as various kinds of consumer electronic products have been constantly developed towards miniaturization and the size of semiconductor components has reduced accordingly, in order to meet requirements of high integration, high performance, low power consumption, and demands for the products.

However, with the miniaturization development of the electronic products, current planar transistors no longer meet the requirements of the products. Non-planar transistors, such as fin field effect transistors (Fin-FET), have been therefore to obtain a high drive current and to lessen short channel effect. However, due to the three-dimensional structure of the Fin-FET, a lot of drawbacks raises as well. For example, in conventional Fin-FET, the fin structure includes a corner with a nearly 90 degrees, which may result in uneven voltage distribution through the channel. Consequently, the quality of the Fin-FET is affected.

Therefore, there is still a need for a novel FET structure and a method of making the same.

SUMMARY OF THE INVENTION

The present invention provides a non-planar FET and a manufacturing method thereof, in which the non-planar FET includes an octagonal fin structure.

According to one embodiment, the present invention provides a non-planar FET which includes a substrate, a fin structure, a gate and a gate dielectric layer. The fin structure is disposed on the substrate. The fin structure includes a first portion adjacent to the substrate wherein the first portion shrinks toward a side of the substrate. The gate is disposed on the fin structure. The gate dielectric layer is disposed between the fin structure and the gate.

According to one embodiment, the present invention provides a method of manufacturing a non-planar FET. First, a substrate is provided wherein an active region and an isolation region are provided on the substrate. A first trench is formed in the substrate in the isolation region, following by filling the first trench with an insulation layer. Then, a part of the substrate in the active region is removed to form a second trench in the active region. At least a spacer is formed on the sidewalls of the second trench. A fin structure in formed in the second trench. Subsequently, a part of the insulation layer is removed and the spacer is completely removed away. Finally, a gate dielectric layer and a gate layer are formed on the fin structure, and a source/drain region is formed in the fin structure.

The present invention uses the spacer and the SEG process to form the fin structure, thereby making a part of the fin structure shrink toward the side of the substrate and a part of the fin structure shrink toward the opposite side of the substrate. Consequently, the fin structure in the present invention has an octagon shape in the cross section so the problem of uneven voltage between the corner and other places in conventional fin structure can be avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 12 are schematic diagrams of the method of manufacturing the non-planar-FET in the present invention, in which:

FIG. 1 shows a cross-sectional view of a non-planar-FET at the beginning of the manufacturing process;

FIG. 2 shows a cross-sectional view of a non-planar-FET after forming an insulation layer 308;

FIG. 3 shows a cross-sectional view of a non-planar-FET after performing an etching back process;

FIG. 4 shows a cross-sectional view of a non-planar-FET after performing another etching back process;

FIG. 5 shows a cross-sectional view of a non-planar-FET after forming a material layer;

FIG. 6 shows a cross-sectional view of a non-planar-FET after performing an anisotropic etching process;

FIG. 7 shows a cross-sectional view of a non-planar-FET after performing a selective epitaxial growth process;

FIG. 8 shows a cross-sectional view of a non-planar-FET after removing a patterned mask layer;

FIG. 9 shows a cross-sectional view of a non-planar-FET after removing a part of the insulation layer;

FIG. 10 shows a cross-sectional view of a non-planar-FET after removing a spacer;

FIG. 11 shows a cross-sectional view of a non-planar-FET taken along a cross-line A-A' in FIG. 12; and FIG. 12 shows a non-planar-FET after forming a gate dielectric layer and a gate.

DETAILED DESCRIPTION

To provide a better understanding of the presented invention, preferred embodiments will be detailed. The preferred embodiments of the present invention are illustrated in the accompanying drawings with numbered elements.

Figure 1:
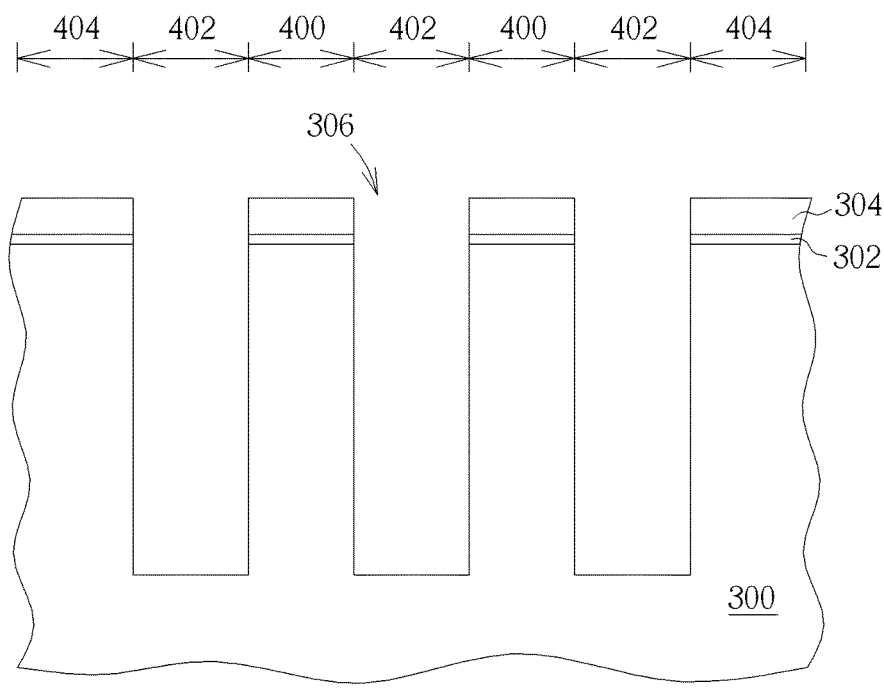

Please refer to FIG. 1 to FIG. 12, which illustrate schematic diagrams of the method of manufacturing a non-planar FET in the present invention. As shown in FIG. 1, a substrate 300 is provided. The substrate 300 may include a silicon substrate, an epitaxial silicon substrate, a silicon germanium substrate, a silicon carbide substrate or a silicon-on-insulator (SOI) substrate, but is not limited thereto. A plurality of active regions 400, an isolation region 402 and a peripheral region 404 are defined on the substrate 300. The active regions 400 are encompassed by the isolation region 402, and the peripheral region 404 refers to the region other than the active regions 400 and the isolation region 402. In the subsequent steps, at least a non-planar FET will be formed respectively in the active region 400 while a shallow trench isolation (STI) is formed in the isolation region 402. It is worth noting that the present embodiment shows two active regions 400 that are encompassed by the isolation region 402. In another embodiment, only one active region 400 is encompassed by the isolation region 402. In another embodiment, more than two active regions 400 are encompassed by the isolation region 402.

As shown in FIG. 1 a patterned liner layer 302 and a patterned mask layer 304 are formed on the substrate 300. The patterned liner layer 302 and the patterned mask layer 304 are formed on the substrate 300 in the active regions 400 and the peripheral region 404, but are not formed on the substrate 300 in the isolation region 402. In one embodiment, the patterned liner layer 302 may include $SiO_2$, and the patterned mask layer 304 may include SiN. In another embodiment, the patterned mask layer 304 can include other materials suitable for a hard mask, such as silicon carbide (SiC), silicon oxynitride (SiON) or a advanced pattern film (APF) provided by the Applied Material Corporation, or the combinations thereof. Next, an etching process is performed by using the patterned hard mask layer 304 as a mask to form a plurality of first trenches 306 in the substrate 300 in the isolation region 402. In one embodiment, the first trench 306 has a depth about 2000 angstroms to 3000 angstroms, but is not limited thereto.

Figure 2:
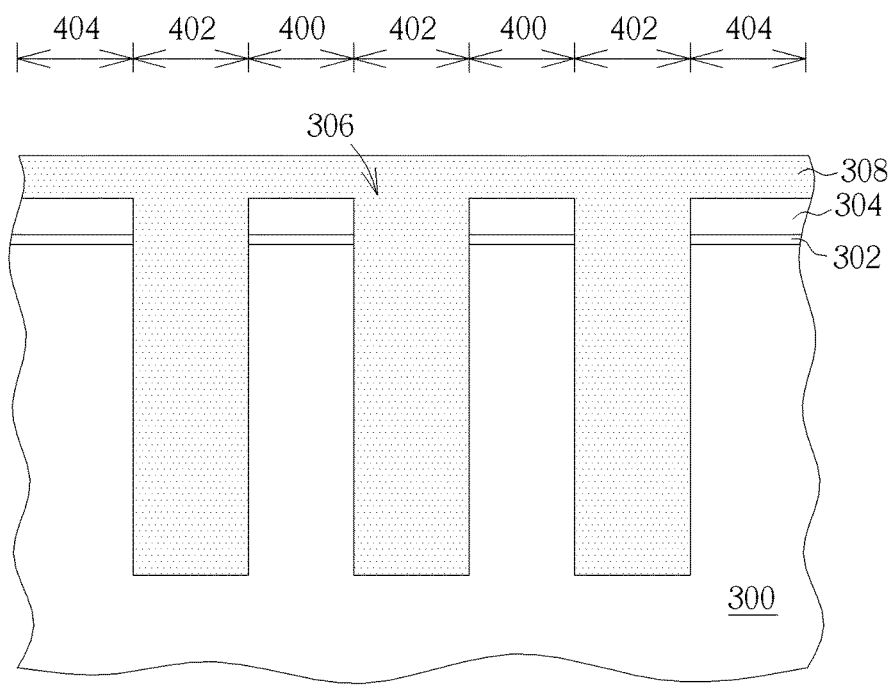

As shown in FIG. 2, an insulation layer 308 is formed comprehensively on the substrate 300 to at least fill each of the first trenches 306. In one embodiment, the insulation layer 308 may include $SiO_2$ or other suitable insulation materials. The method of forming the insulation layer 308, for example, may include a spin-on-glass (SOG) process, a sub-atmospheric pressure CVD (SACVD) process or a high-density plasma CVD (HDPCVD) process, but is not limited thereto. In one embodiment, before forming the insulation layer 308, an in-situ stream growth (ISSG) process can be carried out to form an oxide layer and/or a nitride layer on the bottom surface or the sidewalls of the first trench 306.

Figure 3:
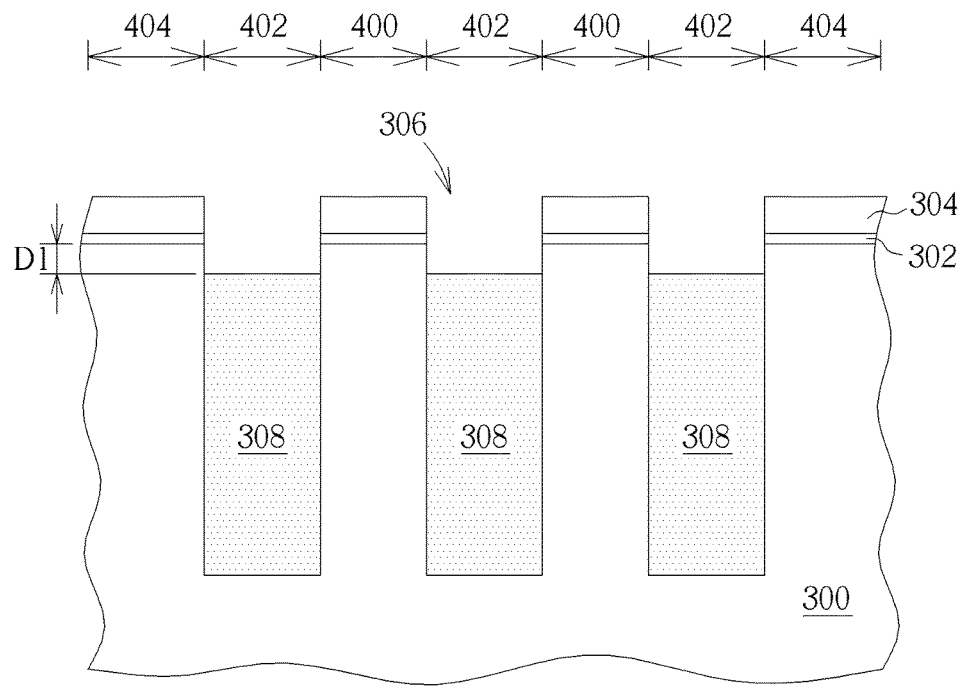

As shown in FIG. 3, an etching back process is performed to completely remove the insulation layer 308 in the active regions 400 and the peripheral region 404, and further remove the insulation layer 308 in the isolation region 402 (that is, in the first trench 306) to a first depth D1 with respect to the substrate 300. In one preferred embodiment, the top surface of the insulation layer 308 is slightly lower than the top surface of the substrate 300 in the active region 400, while in another embodiment, the top surface of the insulation layer 308 is leveled with the top surface of the substrate 300 in the active region 400.

Figure 4:
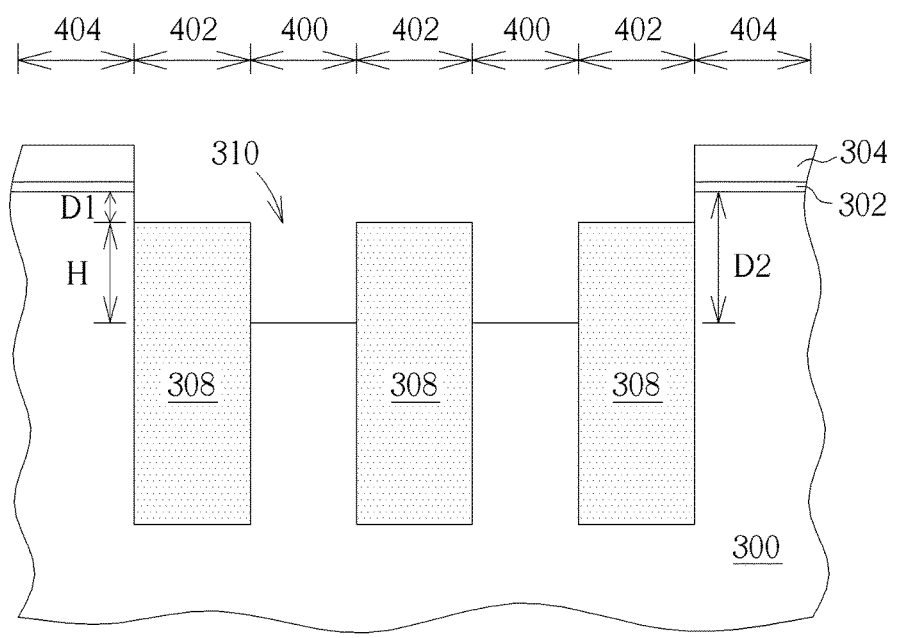

As shown in FIG. 4, an etching process is carried out by using a patterned mask (not shown) as a mask to remove the patterned mask layer 304, the patterned liner layer 302 in the active region 400, and further remove the substrate 300 to a second depth D2. In one preferred embodiment, the second depth D2 is greater than the first depth D1, thus a plurality of second trenches 310 are formed in each of the active regions 400. It is understood that the second trench 310 has a depth H which is about (D2-D1).

Figure 5:
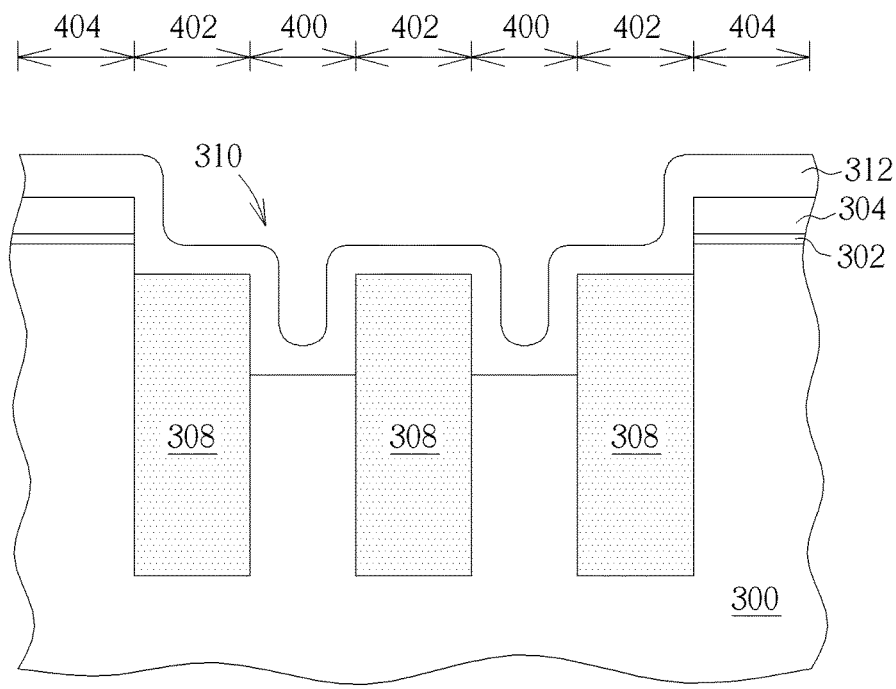

As shown in FIG. 5, a material layer 312 is formed on the substrate 300 completely. The material layer 312 is formed along the patterned mask layer 304, the patterned liner layer 302, the substrate 300, the insulation layer 308 and the substrate 300, to at least cover the substrate 300 located at the border of the isolation region 402, the peripheral region 404, and the surface of the second trench 310. In one preferred embodiment, the material layer 312 has an etching selectivity with respect to the substrate 300 and the insulation layer 308. That is, during one etching process, the etching rate of the material layer 312 is different from those of the substrate 300 and the insulation layer 308. The material layer 312, for example, can be made of the same material as the patterned mask layer 304, such as SiN, while in another embodiment the material layer 312 can be made of different materials.

Figure 6:
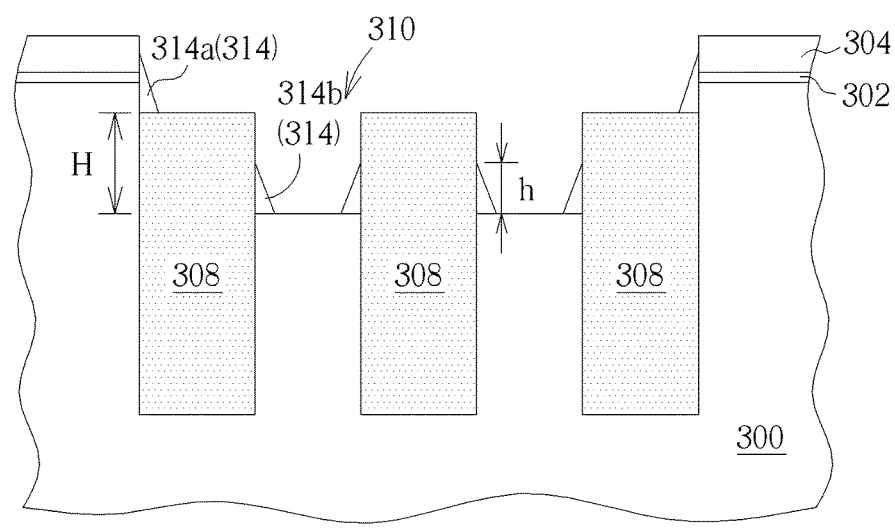

As shown in FIG. 6, an anisotropic etching process such as a dry etching is performed on the material layer 312 for the material layer 312 to become at least a spacer 314. For example, the spacer 314a is located at the border of the peripheral region 404 and the isolation region 402, which is on the sidewalls of the substrate 300; the patterned mask layer 304 and the patterned liner layer 302. In one embodiment, the spacer 314a covers the substrate 300 at that location and the substrate 300 is not exposed. On the other hand, the spacer 314b is formed on the sidewalls of each second trench 310, but the substrate 300 at the bottom of the second trench 310 is exposed. In one preferred embodiment, the spacer 314b exposes a part of the sidewalls of the second trench 310, that is, a part of the sidewall of the insulation layer 308. In detail, the spacer 314b has a height h, which is smaller than the depth H of the second trench 310: therefore h≤H, and more preferably, h=1/2H.

Figure 7:
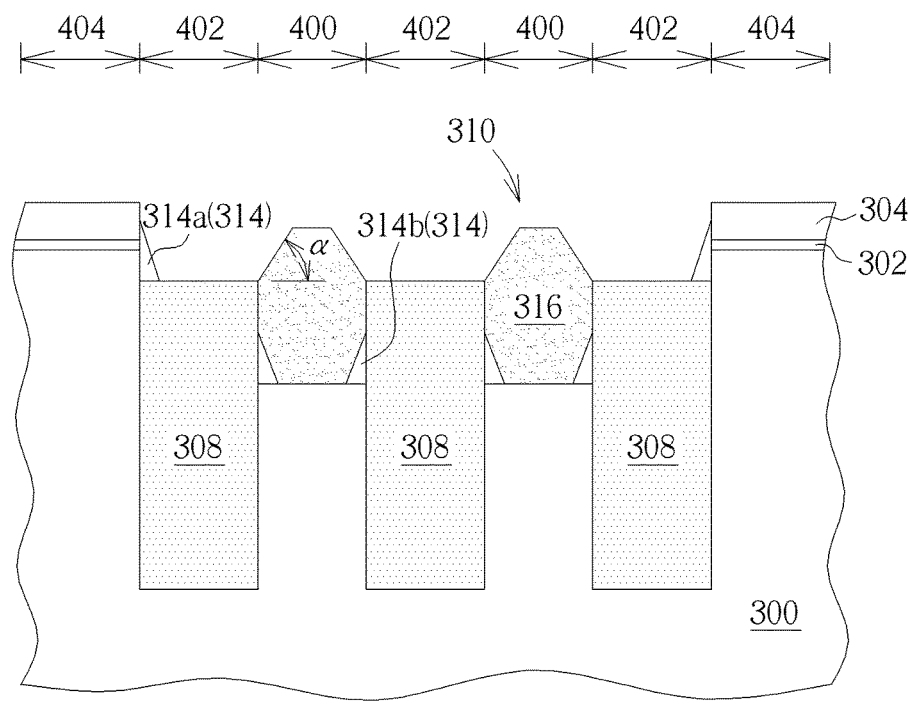

As shown in FIG. 7, a selective epitaxial growth (SEG) process is performed by using the substrate 300 as a seed layer, thereby forming a semiconductor layer 316 in each of the second trenches 310. The semiconductor layer 316 includes silicon, germanium, silicon-germanium, silicon-carbide or the combinations thereof. The semiconductor layer 316 may include a single-layered structure or a multi-layered structure with appropriate stress. It is worth noting that since the substrate 300 located at the border of the peripheral region 404 and the isolation region 402 is covered by the spacer 314a, the semiconductor layer 316 is not formed at that position. On the other hand, the semiconductor layer 316 is formed on the substrate 300 on the bottom surface of the second trench 310 since the substrate 300 at this location is exposed. In one embodiment, the semiconductor layer 316 is grown along the tilted spacer 314b, and then vertically along the insulation layer 308, and finally completely fills the second trench 310. In one preferred embodiment, the semiconductor layer 316 would further grow over the top surface of the insulation layer 308 and protrude from the second trench 310. It is understood that by controlling the parameter of the SEG process, the epitaxial layer would grow along the crystal surface of the seed layer. Accordingly, the semiconductor layer 316 over the insulation layer 308 may include a cross section with a polygon shape, such as a trapezoid shape. The trapezoid may has an angle α between the tilt surface and the horizontal surface in which angle α is about 50 degrees to 60 degrees, preferably 54.7 degrees.

Figure 8:
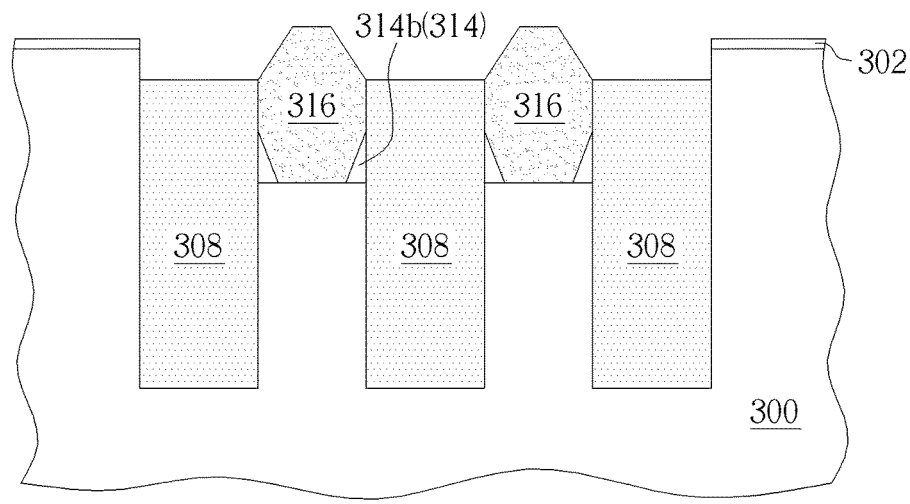

As shown in FIG. 8, the spacer 314a and the patterned mask layer 304 are removed. In one preferred embodiment, the spacer 314a and the patterned mask layer 304 are made of the same material and can be removed in one single etching process. In another embodiment, if the spacer 314a and the patterned mask layer 304 are made of different materials, they can be removed in different etching processes.

Figure 9:
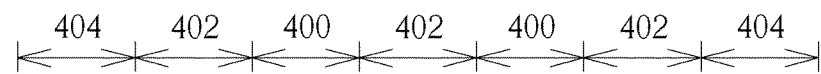
Figure 9:
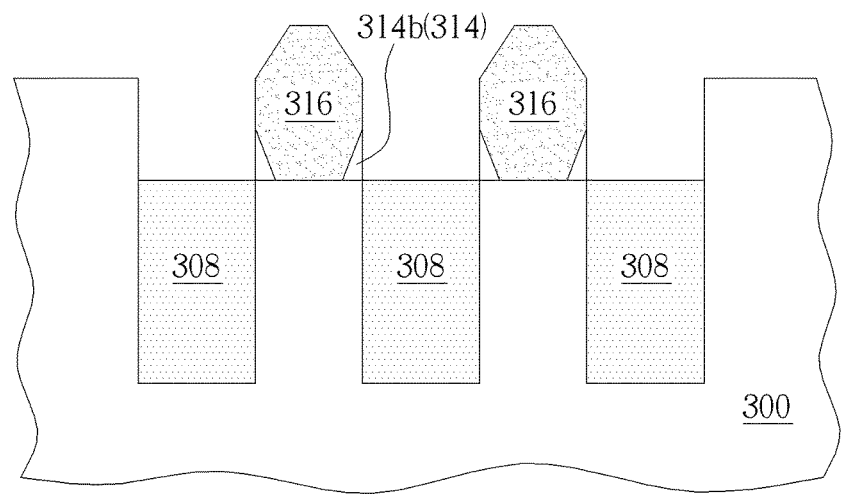

As shown in FIG. 9, the patterned liner layer 302 in the peripheral region 404 and a part of the insulation layer 308 in the isolation region 402 are removed. In one preferred embodiment, the patterned liner layer 302 and the insulation layer 308 are made of the same material and can be removed in one single etching process. In another embodiment, if the patterned liner layer 302 and the insulation layer 308 are made of different materials, they can be removed in different etching processes. It is noted that the insulation layer 308 in the isolation region 402 will be etched up to a predetermined depth, thereby exposing the spacer 314b. The predetermined depth is greater than (H-h). Preferably, the insulation layer 308 is substantially leveled with the substrate 300 in the active region 400.

Figure 10:
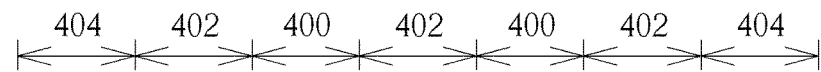
Figure 10:
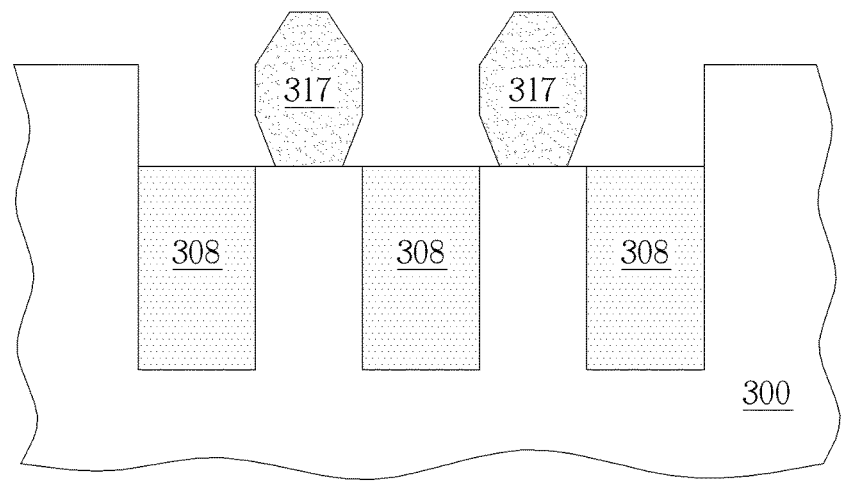

As shown in FIG. 10, the spacer 314b is removed away from the substrate 300. In one embodiment, if the spacer 314b includes SiN, a wet etching process using hot phosphoric acid is performed to remove the spacer 314b. This way, the semiconductor layer 316 in the active region 400 becomes a fin structure 317, and the fin structure 317 has an octagonal cross section.

Figure 11:
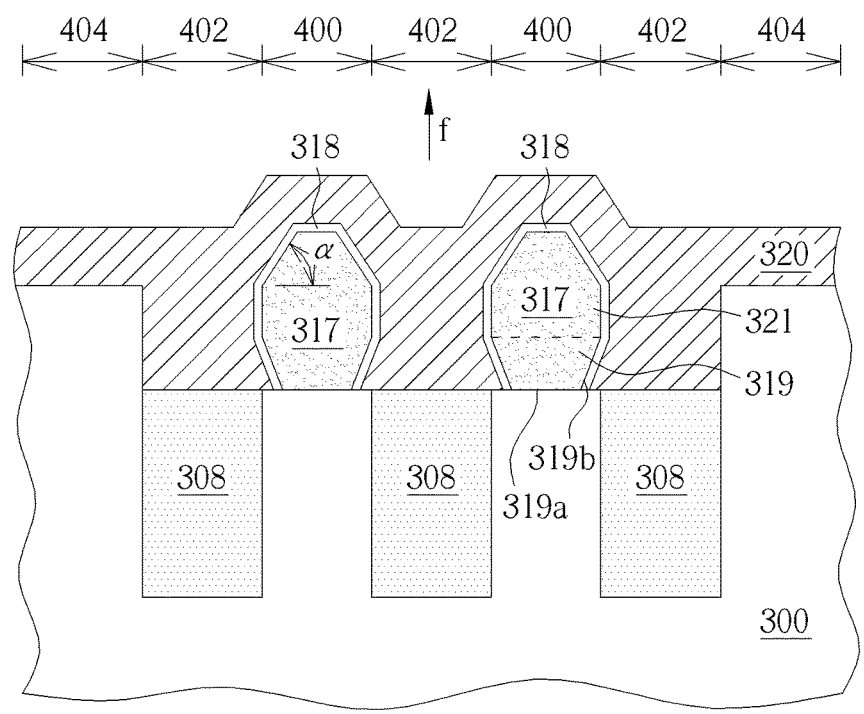
Figure 12:
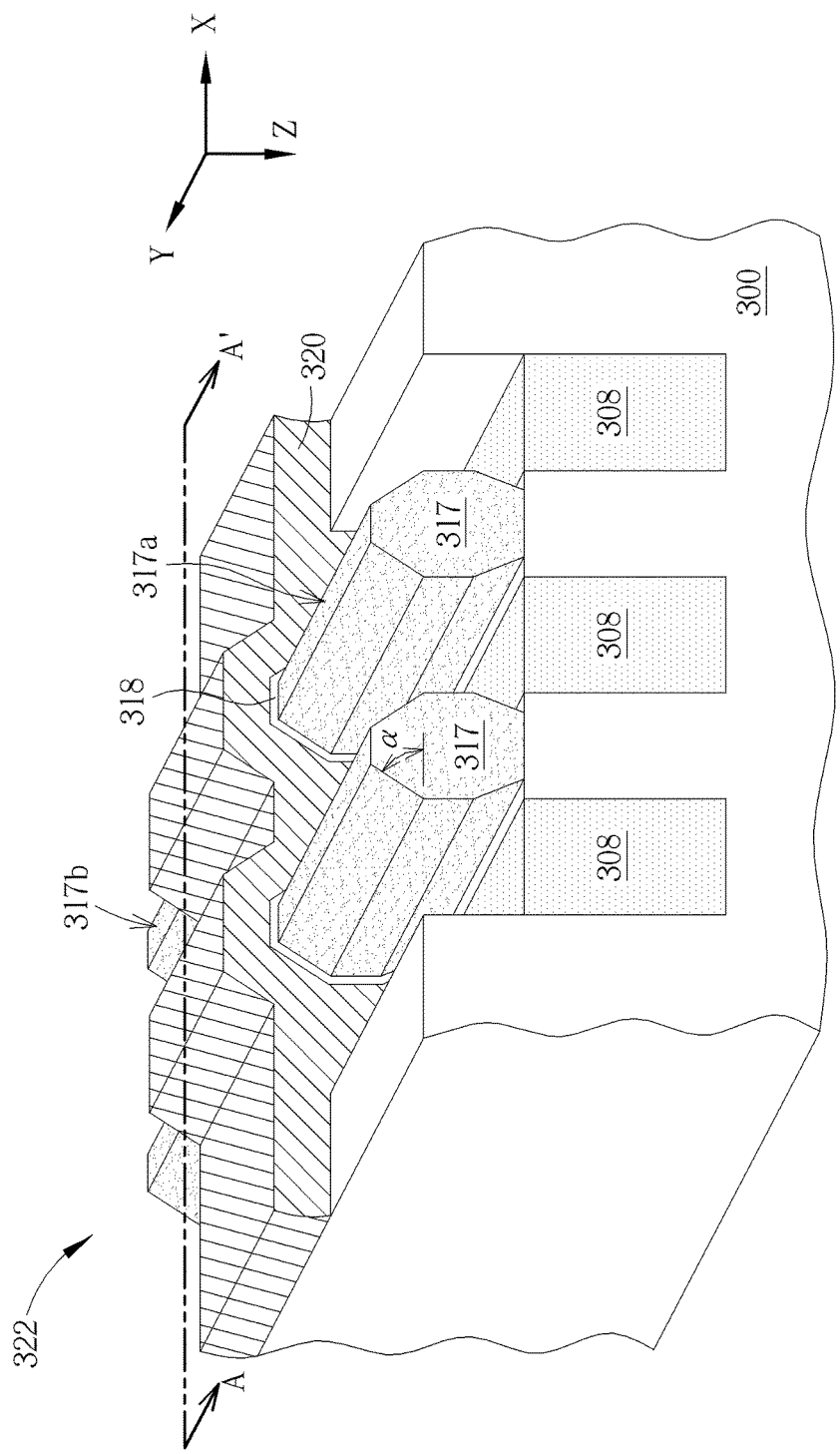

As shown in FIG. 11, a gate dielectric layer 318 is formed on the substrate 300 to cover the fin structure 317. In one preferred embodiment, the gate dielectric layer 318 includes $SiO_2$ which is evenly formed on the surface of the fin structure 317 by a thermal oxidation process. In another embodiment, the gate dielectric layer 318 can include other materials such as a high-dielectric material which is formed by an atomic layer deposition (ALD) process. The high-dielectric material has a dielectric index substantially higher than 4, for example, hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT) and barium strontium titanate ($Ba_xSr_{1-x}TiO_3$, BST), but is not limited thereto. Then, a gate layer (not shown) is formed on the gate dielectric layer 318. The gate layer may include various kinds of conductive material such as poly-silicon and metal. The gate layer is then patterned so that the gate layer becomes a required gate 320 structure. Finally, an ion implant process is performed to form a source region 317a and a drain region 317b in the fin structure 317, as shown in FIG. 12. Through the above steps, a non-planar FET 322 is formed in the active region 400 and the insulation layer 308 in the isolation region 402 becomes the STI. In another embodiment, an inter-layer dielectric (ILD) layer (not shown) can be further formed on the non-planar FET 322, and a plurality of contact holes (not shown) are formed therein to provide appropriate input/output pathway toward outer circuits.

As shown in FIG. 11 and FIG. 12, the present invention provides a non-planar FET structure. The non-planar FET 322 includes a substrate 300, a fin structure 317, a gate 320 and a gate dielectric layer 318. The fin structure 317 is disposed on the substrate 300. The gate 320 is disposed on the fin structure 317, and the gate dielectric layer 318 is disposed between the gate 320 and the fin structure 317. It is one salient feature that the fin structure 317 has an octagonal shape in the cross section. In detail, the fin structure 317 has a first part 319 and a second part 321 disposed on the first part 319. The first part 319 is adjacent to the substrate 300 and shrinks on the side of the substrate 300. The first part 319 has a bottom surface 319a and two sidewalls 319b encompassing the bottom surface 319a. The bottom surface 319a is substantially parallel to the substrate 300, meaning that the bottom surface 319a is vertical to a normal line of the substrate 300. The second part 321 is composed of a rectangle and a trapezoid, in which the trapezoid shrinks on the opposite side of the substrate 300. The trapezoid has an angle a which is about 50 degrees to 60 degrees, preferably 54.7 degrees.

The present invention provides a novel method to form the fin structure 317 of the non-planar FET 322 and the fin structure 317 has an octagonal shape in the cross section. In comparison with the conventional fin structure having a rectangular shape in the cross section, the four corners of the fin structure are chamfered in the present invention. Consequently, the problem of uneven voltage of the fin structure can be avoided.

Figure 13:
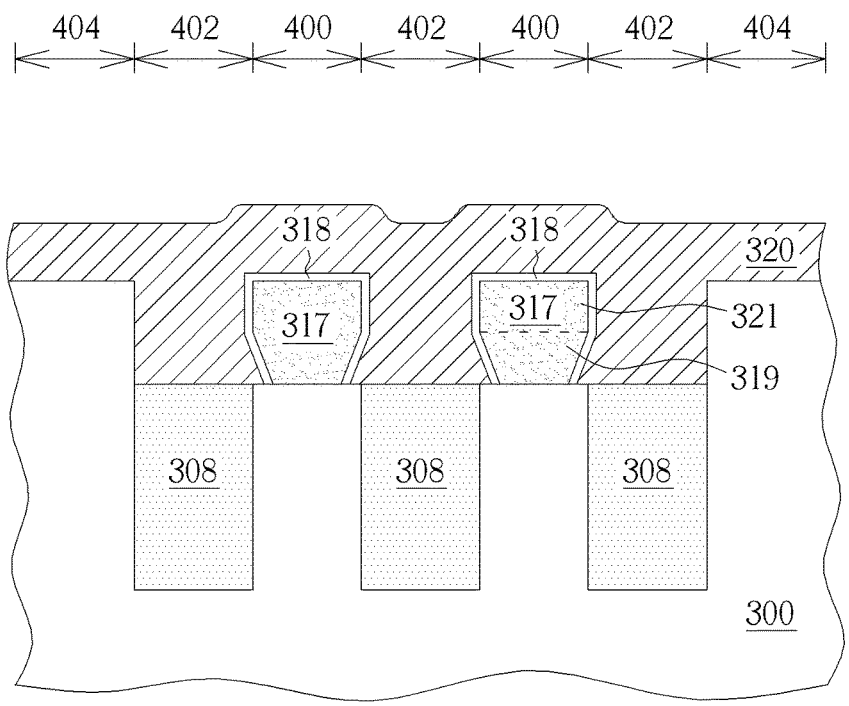
FIG. 13 and FIG. 14 are schematic diagrams of the non-planar-FET according to another embodiment in the present invention.
Figure 14:
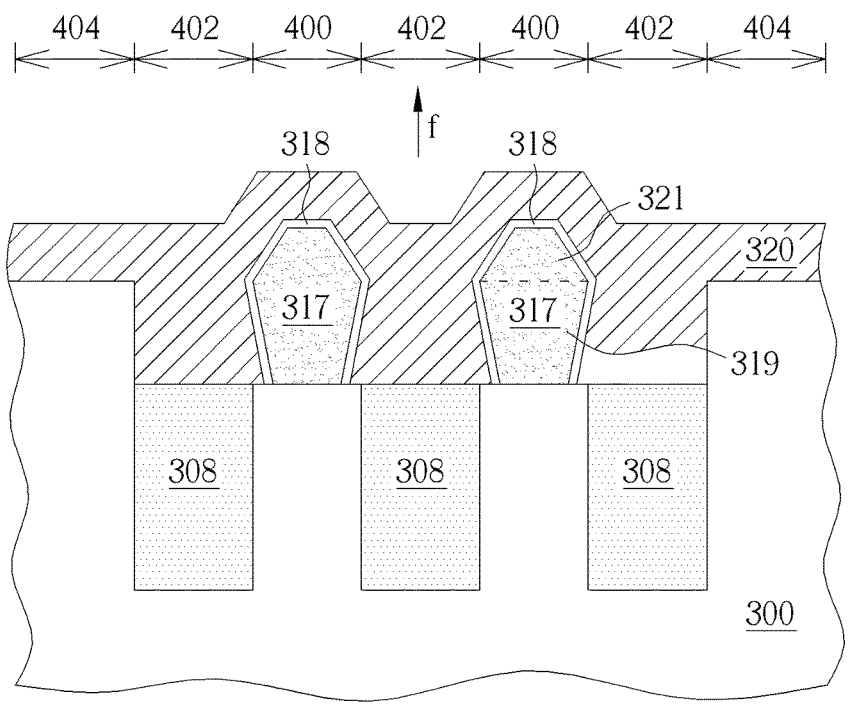

It is noted that by altering the manufacturing method, the fin structure 317 in the present invention can further include other shapes. Please refer to FIG. 13 and FIG. 14, which are schematic diagrams of the Fin-FIN according to another embodiment of the present invention. As shown in FIG. 7, if the semiconductor layer 316 is formed to be not higher than the insulation layer 308, for example, by adjusting the SEG process or etching back after over growth of the semiconductor layer 308, the semiconductor layer 316 would be leveled with the insulation layer 308, producing the structure as shown in FIG. 13. As shown in FIG. 13, the first part 319 of the fin structure 317 shrinks on the side of the substrate 300, while the second part 321 of the fin structure 317 has a rectangular shape in the cross section with a fixed width. In another embodiment, as shown in FIG. 6, if the spacer 314a does not expose a part of the sidewalls of the insulation layer 308, a structure as shown in FIG. 14 will be obtained. The first part 319 of the fin structure 317 shrinks on the side of the substrate 300, while the second part 321 of the fin structure 317 has a trapezoidal shape in the cross section which shrinks to an opposite side of the substrate 300.

In summary, the present invention provides a non-planar FET and a manufacturing method thereof. The present invention uses the spacer and the SEG process to form the fin structure, thereby making a part of the fin structure shrink toward the side of the substrate and a part of the fin structure shrink toward the opposite side of the substrate. Consequently, the fin structure in the present invention has an octagonal shape in the cross section so the problem of uneven voltage between the corner and other place in conventional fin structure can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a non-planar FET, comprising:
   providing a substrate having at least an active region and an isolation region, wherein the active region is encompassed by the isolation region;
   forming a first trench in the substrate in the isolation region and forming an insulation layer in the first trench;
   removing a part of the substrate in the active region to form a second trench in the active region;
   forming at least a spacer on the sidewalls of the second trench;
   forming a fin structure in the second trench;
   removing a part of the insulation layer and completely removing the spacer;
   forming a gate dielectric layer and a gate on the fin structure;
   forming a source/drain region in the fin structure; and
   wherein the removing of the part of the insulation layer, a top surface of the insulation layer is leveled with a bottom surface of the fin structure, and a top surface of the substrate is higher than the top surface of the insulation layer.

2. The method of manufacturing a non-planar FET according to claim 1, wherein the step of forming the insulation layer in the first trench comprises:
   forming the insulation layer on the substrate; and
   removing the insulation layer outside the first trench.

3. The method of manufacturing a non-planar FET according to claim 2, further comprising making the top surface of the insulation layer lower than the top surface of the substrate.

4. The method of manufacturing a non-planar FET according to claim 1, wherein the step of forming the spacer comprises:
   forming a material layer on the substrate; and
   performing an anisotropic etching process to make the material layer become the spacer.

5. The method of manufacturing a non-planar FET according to claim 1, wherein the spacer exposes a part of the sidewalls of the insulation layer.

6. The method of manufacturing a non-planar FET according to claim 1, wherein the spacer is further formed on the insulation layer to cover the sidewalls of the substrate over the insulation layer.

7. The method of manufacturing a non-planar FET according to claim 1, wherein the step of forming the fin structure comprises a selective epitaxial growth process.

8. The method of manufacturing a non-planar FET according to claim 7, wherein during the selective epitaxial growth process, the fin structure grows over the top surface of the insulation layer.

9. The method of manufacturing a non-planar FET according to claim 1, wherein the fin structure has an octagonal shape from end to end in the cross section parallel to the gate.

10. The method of manufacturing a non-planar FET according to claim 9, wherein the fin structure comprises a first part adjacent to the substrate, and the first part shrinks toward a side of the substrate.

* * * * *